United States Patent
Zhang et al.

(10) Patent No.: US 10,712,769 B2
(45) Date of Patent: Jul. 14, 2020

(54) METHOD AND APPARATUS FOR CLOCK SIGNAL DISTRIBUTION

(71) Applicant: Oracle International Corporation, Redwood City, CA (US)

(72) Inventors: Dabin Zhang, Santa Clara, CA (US); Philip P. Kwan, San Francisco, CA (US); Zuxu Qin, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 294 days.

(21) Appl. No.: 15/678,811

(22) Filed: Aug. 16, 2017

(65) Prior Publication Data

US 2019/0056760 A1    Feb. 21, 2019

(51) Int. Cl.
| | |
|---|---|
| *G06F 1/10* | (2006.01) |
| *H03K 19/0185* | (2006.01) |
| *H03F 3/45* | (2006.01) |
| *H03K 5/15* | (2006.01) |

(52) U.S. Cl.
CPC ............ *G06F 1/10* (2013.01); *H03F 3/45183* (2013.01); *H03K 5/1506* (2013.01); *H03K 19/018528* (2013.01); *H03F 2203/45332* (2013.01); *H03F 2203/45702* (2013.01)

(58) Field of Classification Search
CPC ......... H03K 5/1506; H03K 19/018528; H03K 19/018578; H03K 19/09432; H03K 19/09436; G06F 1/10
See application file for complete search history.

(56) References Cited

U.S. PATENT DOCUMENTS

| | | | |
|---|---|---|---|
| 7,355,451 B2 | 4/2008 | Azadet | |
| 7,759,992 B2 | 7/2010 | Ibuka | |
| 7,839,161 B2 * | 11/2010 | Momtaz | G06F 1/10 326/21 |
| 7,848,404 B2 | 12/2010 | An | |
| 8,536,922 B2 | 9/2013 | Lin | |
| 9,209,809 B1 * | 12/2015 | Geary | H03K 19/00384 |
| 9,281,810 B2 | 3/2016 | Singh et al. | |
| 9,362,877 B2 * | 6/2016 | Maeda | H03G 3/004 |
| 9,608,611 B1 * | 3/2017 | Hearne | H03K 5/135 |
| 9,876,489 B1 * | 1/2018 | Casey | H03K 5/1515 |
| 2013/0249612 A1 | 9/2013 | Zerbe | |

(Continued)

FOREIGN PATENT DOCUMENTS

WO    WO-2014024263 A1 *    2/2014    ............ H03K 5/15

OTHER PUBLICATIONS

English translation of WO-2014024263 (Year: 2014).*

(Continued)

*Primary Examiner* — Patrick O Neill
(74) *Attorney, Agent, or Firm* — Kowert, Hood, Munyon, Rankin & Goetzel, P.C.; Erik A. Heter

(57) ABSTRACT

A clock distribution network and method of distributing a clock signal is disclosed. In one embodiment, a clock distribution network is coupled to at least a first circuit. The clock distribution network includes a clock source configured to generate a differential clock signal and provide it to a current mode logic (CML) driver. The CML driver is configured to transmit the clock signal over a differential signal path. A CML receiver is coupled to receive the clock signal via the differential signal path.

15 Claims, 7 Drawing Sheets

(56) References Cited

U.S. PATENT DOCUMENTS

2017/0012614 A1   1/2017  Guthaus

OTHER PUBLICATIONS

Heydari, et al; "Design of Ultra High-Speed CMOS CML buffers and Latches", Proceedings of the 2003 International Symposium on Circuit and Systems, 2003. ISCAS '03, vol. 2, May 2003, 4 pages.

Rahman, et al; "Implimentation and evaluation of an efficient clock distribution network for deep-submicron technology", 2015 2nd International Conference on Electrical Information and Communication Technology (EICT), Dec. 2015, Abstract only.

* cited by examiner

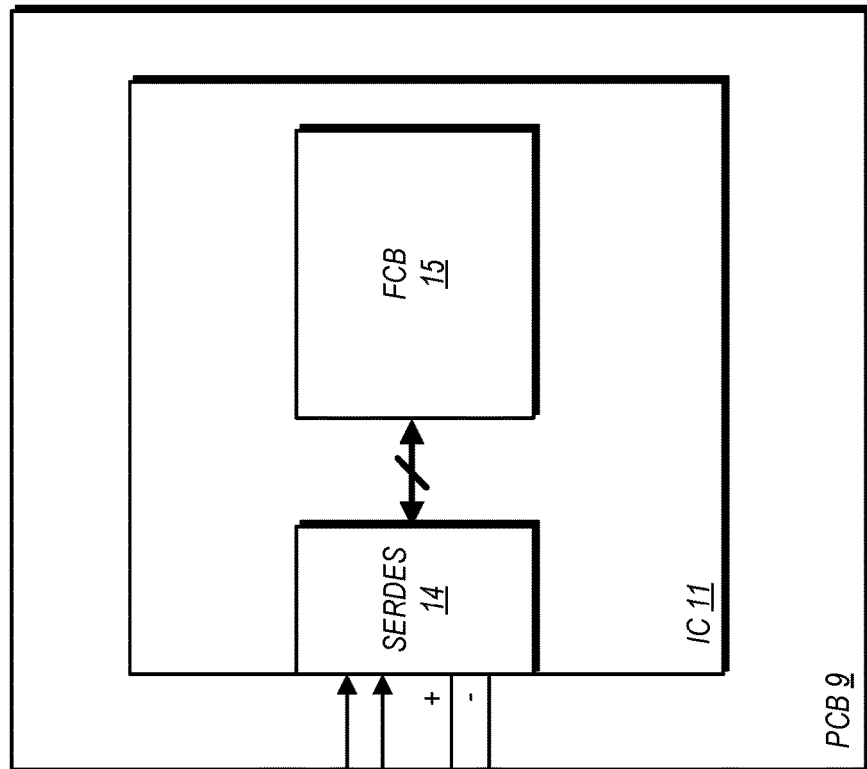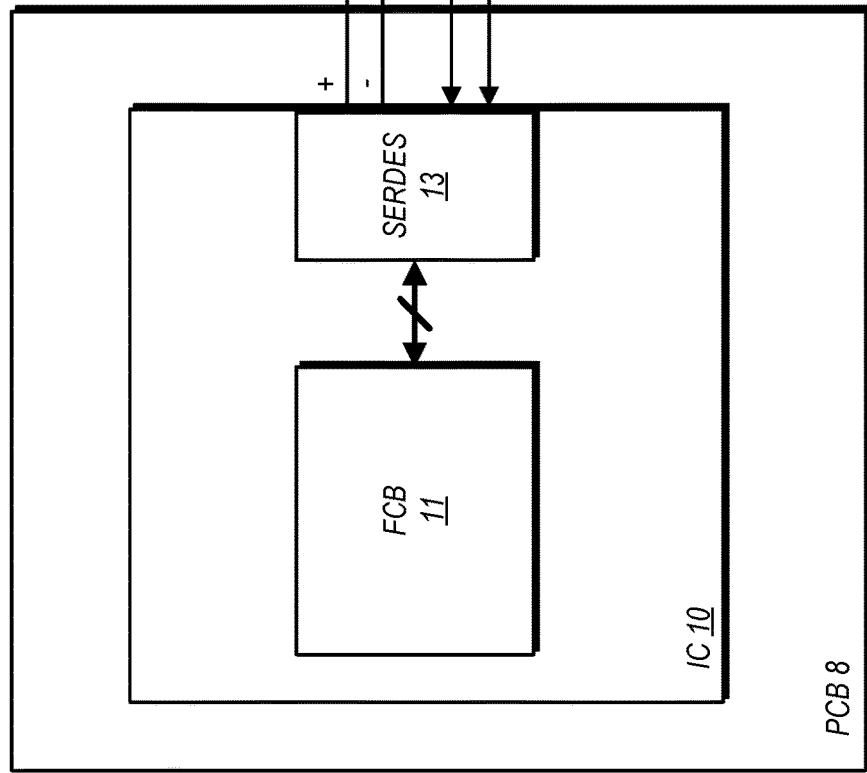
Fig. 1

METHOD AND APPARATUS FOR CLOCK SIGNAL DISTRIBUTION

BACKGROUND

Technical Field

This disclosure is directed to electronic circuits, and more particularly, to networks for distributing clock signals in electronic circuits.

Description of the Related Art

In implementing clocked digital circuits, a clock signal is provided. The clock signal may be generated by, e.g. a phase-locked loop (PLL) and distributed through various other circuits and connection mechanisms to the digital circuits that are clock consumers. Such circuits may include buffers and other mechanisms to ensure that a clock signal arrives at its destination with good signal integrity.

In distributing a clock signal, various factors can affect the quality of the signal as it arrives at its destination. One of these factors is jitter, which is a deviation from the true periodicity of the clock signal. Another factor is duty cycle distortion, which is a deviation from an intended duty cycle. For example, a clock signal may have an intended duty cycle of 50%, whereas duty cycle distortion may reduce the duty cycle to 45%. Other factors include good P/N phase (0/180 degree) balance, and good I/Q balance (e.g., subsequent to dividing a clock signal with a divider). Noise in the signal paths can also affect the integrity of a clock signal, and may exacerbate those factors previously mentioned. Accordingly, clock distribution networks may be designed to minimize these factors.

SUMMARY

A clock distribution network and method of distributing a clock signal is disclosed. In one embodiment, a clock distribution network is coupled to at least a first circuit. The clock distribution network includes a clock source configured to generate a differential clock signal and provide it to a current mode logic (CML) driver. The CML driver is configured to transmit the clock signal over a differential signal path. A CML receiver is coupled to receive the clock signal via the differential signal path.

In one embodiment, each of the CML driver and CML receiver may provide AC (alternating current) coupling of the differential clock signal between respective input and output stages. The CML receiver is configured to receive the clock signal through a CML input, and is configured to provide the clock signal to the divider via a CMOS (complementary metal oxide semiconductor) output. The output stage of the CML receiver may include an optional duty cycle correction circuit configured to correct the duty cycle of the received clock signal from any deviations incurred during its transmission. Amplifier circuitry in the output stage of the CML receiver may also increase the signal strength of the received clock signal.

In some embodiments, a swing detection circuit may be coupled to the differential signal path. Based on the amount of signal swing detected, the swing detection circuit may regulate an amount of current provided by a current source in the CML driver. Some embodiments may also include a divider is coupled to receive the clock signal from the CML receiver. The divider is configured to divide the frequency of the differential clock signal to produce a reduced frequency clock signal. The reduced frequency clock signal is then distributed to the first circuit

BRIEF DESCRIPTION OF THE DRAWINGS

The following detailed description makes reference to the accompanying drawings, which are now briefly described.

FIG. 1 is a block diagram of one embodiment of an exemplary system having first and second ICs coupled by a communications link.

Figure 2:
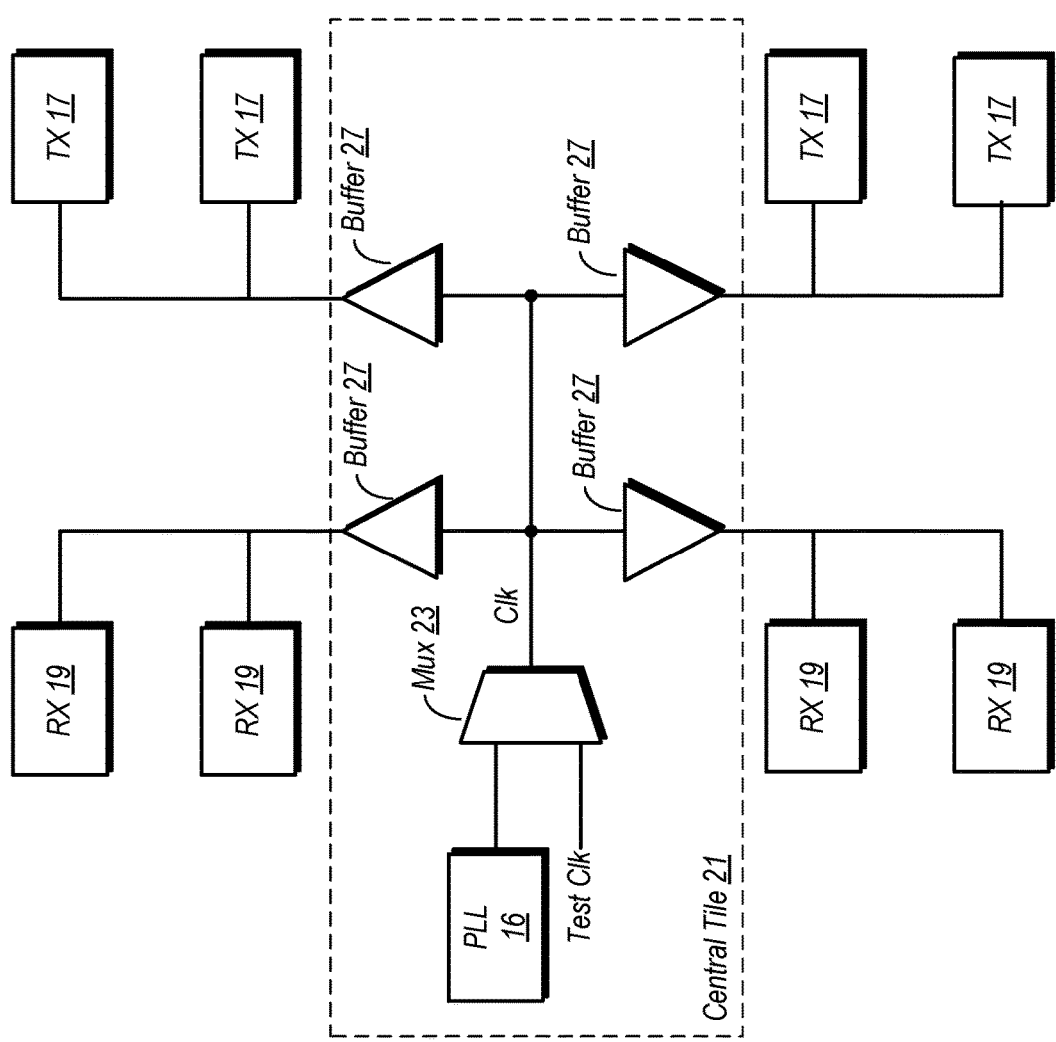
FIG. 2 is a block diagram of one embodiment of a clock distribution network implemented on an IC.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(*f*) during prosecution, it will recite claim elements using the "means for" [performing a function] construct.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, and techniques have not been shown in detail to avoid obscuring the disclosed embodiments.

DETAILED DESCRIPTION OF EMBODIMENTS

FIG. 1 is a block diagram of one embodiment of an exemplary system having first and second ICs coupled by a communications link. It is noted that the embodiment shown here is exemplary, and does not necessarily include all elements that may be present in such a system. Instead, the embodiment is illustrated here in a simplified manner for the sake of illustration. Furthermore, while the illustrated embodiment is directed to two separate ICs implemented on separate PCBs, the disclosure is not limited to such embodiments. Embodiments in which both ICs are present on a single PCB, or in which the communications link is an intra-IC link (rather than inter-IC) are also possible and contemplated.

In the embodiment shown, system 5 includes a first and second ICs, IC 10 and IC 11, implemented on a printed circuit boards (PCBs) 8 and 9, respectively. IC 10 and IC 11 are coupled to one another by communications link 7, which includes two differential signal paths. It is noted that additional communications links may be present. Communications link 7 in the embodiment shown includes SERDES (serializer/deserializer) units 13 and 14, which are circuits implemented on IC 10 and IC 11, respectively. In IC 10, SERDES unit 13 is coupled to functional circuit block (FCB) 11. In IC 11, SERDES unit 14, is coupled to FCB 15. Data may be transmitted between a SERDES unit and a respectively coupled FCB in parallel. Outgoing data may, in a SERDES unit, be converted from parallel to series and transmitted across a differential signal path to a SERDES unit in the other IC. Incoming data may be received serially by a SERDES unit and be converted to parallel for transmission to a correspondingly coupled FCB.

In the embodiment shown, communications link may be a high speed link, capable of data transmissions of tens of gigabits per second (Gbps). As such, each of the SERDES units shown in FIG. 1 may include a clock distribution network as discussed below. The clock distribution network in each of the SERDES units may support the distribution of clock signals to, e.g., a number of transmitters and receivers in a SERDES unit. Given the high data rates of the communications link 7, the clock signals distributed in each SERDES unit in the embodiment shown are commensurate with these data rates. The distribution of the clock signal to the transmitters and receivers in the SERDES units will not be discussed in further detail with reference to the subsequent figures.

FIG. 2 is a block diagram of one embodiment of a clock distribution network implemented on an IC. In the embodiment shown, a central tile 21 is coupled to provide a clock signal to multiple instances of transmitter 17 and receiver 19. The multiple instances of these circuits may be implemented in a SERDES unit of an IC, such as SERDES unit 13 in IC 10 of FIG. 1. The central tile 21 includes a PLL 16, a multiplexer 23, and buffers 27. The buffers can be of any number, and can, e.g., feed groups of transmitters and receiver separately, and so forth. Additional components (some of which are discussed below) may be present, but are not shown here for the sake of simplicity.

PLL 16 in the embodiment shown is configured to generate a clock signal. In one embodiment, the clock signal may be a differential clock signal. The clock signal may be received by multiplexer 23, which is optional. A second input to multiplexer 23 may be used to convey a test clock to the illustrated circuits when conducting test procedures. The output of multiplexer 23 is coupled to inputs of a number of buffers 27. The buffers 27 shown here may be representative of additional circuitry, such as various drivers and receivers. The output of each is coupled to respective ones of the transmitters 17 and receivers 19.

Figure 3:
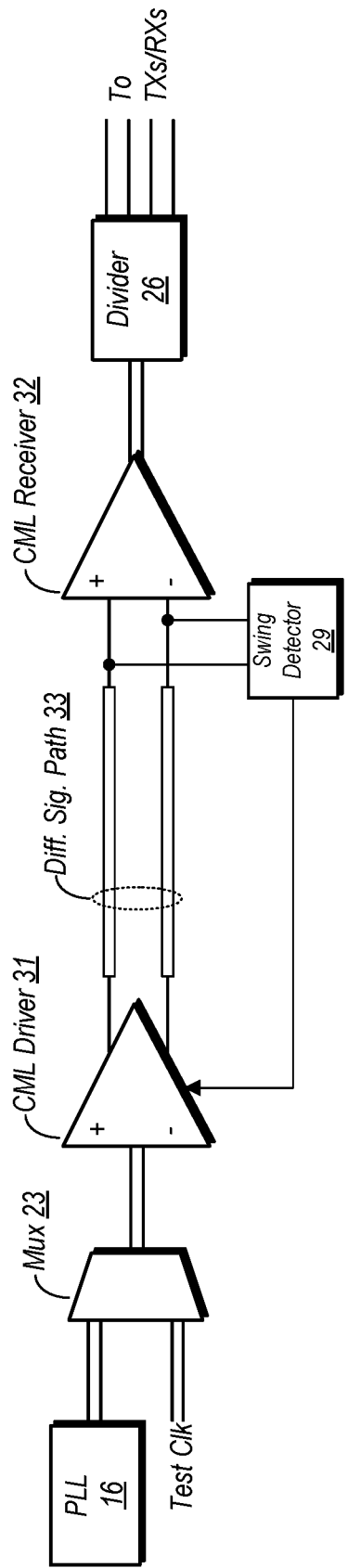
FIG. 3 is a diagram of one portion of an embodiment of a clock distribution network.

FIG. 3 illustrates one embodiment of a clock distribution network in accordance with the disclosure. The illustrated embodiment includes PLL 16 and multiplexer 23 as discussed above. Additionally, the clock distribution network shown in FIG. 3 includes a current mode logic (CML) driver 31, a differential signal path 33, a swing detector 29, a CML receiver 32, and a divider 26.

PLL 16 in the embodiment shown is configured to generate and output a fully differential clock signal. This differential clock signal is provided, via multiplexer 23 (when selected), to CML driver 31. CML driver 31 receives the clock signal and provided it as a CML output onto differential signal path 33. The differential clock signal is received by CML receiver 32, as a CML input. CML receiver 32 outputs the differential clock signal as a CMOS output, and provides it to divider 26. Divider 26 then divides the frequency of the received differential clock signal to produce a reduced rate clock signal. This reduced rate (or frequency) clock signal may then be distributed to the various transmitter and receiver circuits, such as those shown in FIG. 2. It is further noted that the reduced rate clock signal may be distributed as either a single-ended clock signal or as a differential clock signal, depending on the specific embodiment.

It is noted that while transmitters and receivers are used as exemplary clock consumers in this discussion, the disclosure is not limited as such. On the contrary, the clock distribution apparatus discussed herein may be used to deliver clock signals to virtually any type of circuit that consumes or is otherwise synchronized to a clock signal.

In the embodiment shown, the clock distribution network includes an optional swing detector 27, which is not necessarily present in all embodiments. In this particular embodiment, swing detector 27 may detect an amount of voltage swing on each line of differential signal path 33, toward the receiver side of the clock distribution network. Embodiments in which swing detector 27 is placed in other locations (e.g., in the middle, or closer to the CML driver) are also possible and contemplated. Based on the amount of voltage swing detected, swing detector 27 generates a feedback signal provided to CML driver 31. In one embodiment, the feedback signal may be provided to a tail current source therein. If the voltage swing is less than a desired amount, the feedback signal generated by swing detector 27 may cause the amount of current in the tail current source to be increased. If the voltage swing is greater than a desired amount, the feedback signal generated by swing detector 27 may cause the amount of current in the tail current source to be reduced. In another embodiment, the feedback signal could control inverters in the CML driver, activating more inverters if the detected swing is too low or reducing the number of active inverters if the swing is too high (examples of these inverters are shown in the drawing of the CML driver, which is discussed below). Thus, swing detector 27 and the feedback loop of which it is a part may ensure that the voltage swing at the receiver end of the clock distribution network falls within a specified range.

By utilizing CML circuits for driver 31 and receiver 32, the differential clock signal may be transferred across differential signal path 33 at lower voltages (and thus, lower voltage swings) than otherwise possible at CMOS voltage levels. This in turn may allow for reduced power consumption. This may also enable a longer clock distribution distance. Typically, for a given piece of wire, its RC time constant can make it difficult, if not impossible, to deliver a full swing signal at a high enough frequency over a long enough distance. By utilizing CML circuits, the voltage swing requirements are reduced, and may thus enable physically longer clock distribution paths.

Figure 4:
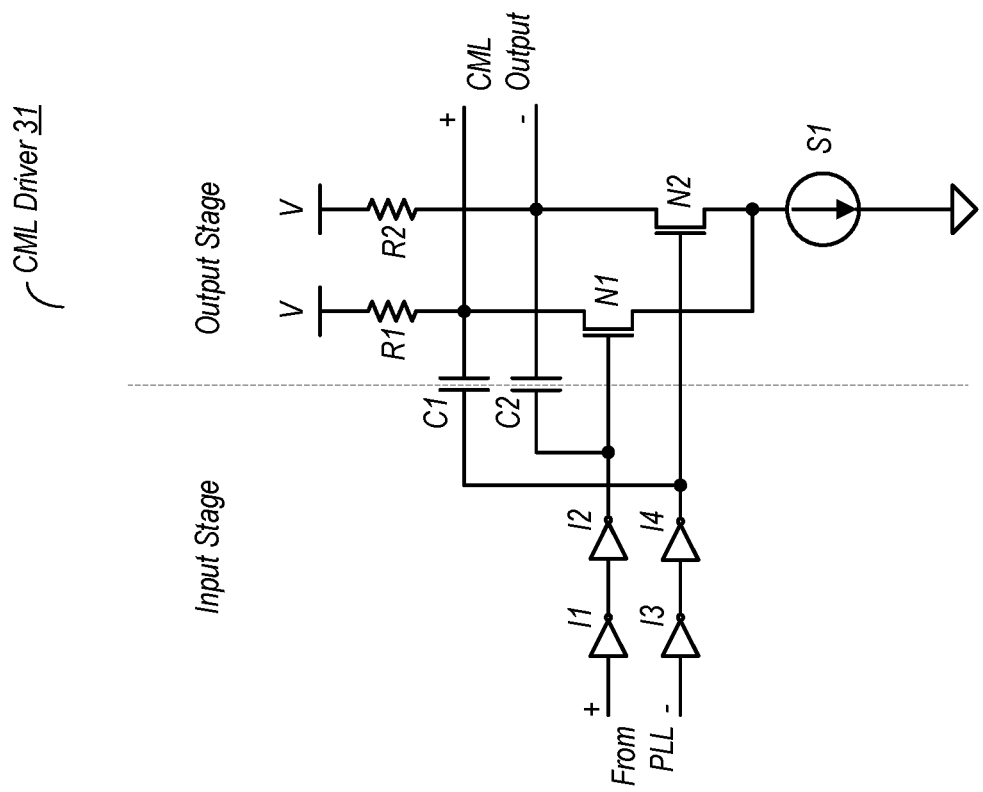
FIG. 4 is a schematic diagram of one embodiment of a CML driver circuit.

FIG. 4 is a schematic diagram of one embodiment of a CML driver circuit. In the embodiment shown, CML driver 31 may be roughly divided into an input stage and an output stage. At the input stage, CML driver may receive the true and complementary portions of the differential clock signal on the inputs labeled '+' and '−', respectively. In this embodiment, the differential clock signal is received from the PLL at CMOS voltage levels, and conveyed through inverters I1 and I2 (on the '+' input) and inverters I3 and I4 (on the '−' input). It is noted that there may be additional inverter stages between I1/I2 and I3/I4 present in some embodiments.

The output of inverters I2 and I4 in this embodiment are coupled to gate terminals of NMOS transistors N1 and N2 in the illustrated embodiment. Since the signals output from I2 and I4 are of opposite polarity with respect to one another, N1 and N2 may be alternately activated and de-activated. Transistors N1 and N2, when active, draw current through resistors R1 and R2, respectively. This current is partially controlled by tail current source S1, which is coupled to the source terminals of N1 and N2. As previously discussed in FIG. 3, embodiments are possible and contemplated in which the amount of current through current tail current source is based at least partly on a feedback signal provided from a swing detector circuit. Regulation of tail current source S1 may optimize power and slew rate of CML driver 31.

Capacitors C1 and C2 are coupled between the input stage and output stage of CML driver 31. These capacitors provide AC coupling of the differential clock signal between the input and output of the circuit. During operation, these capacitors inject AC current into the signal path to the CML output, and may also reduce DC power consumption. Furthermore, the injection of AC current by capacitors C1 and C2 may improve the edge rate for CML driver 31. The use of capacitors C1 and C2 may also allow for the design of CML driver 31 to consume less area relative to designs in which a peaking inductor is utilized.

Figure 5:
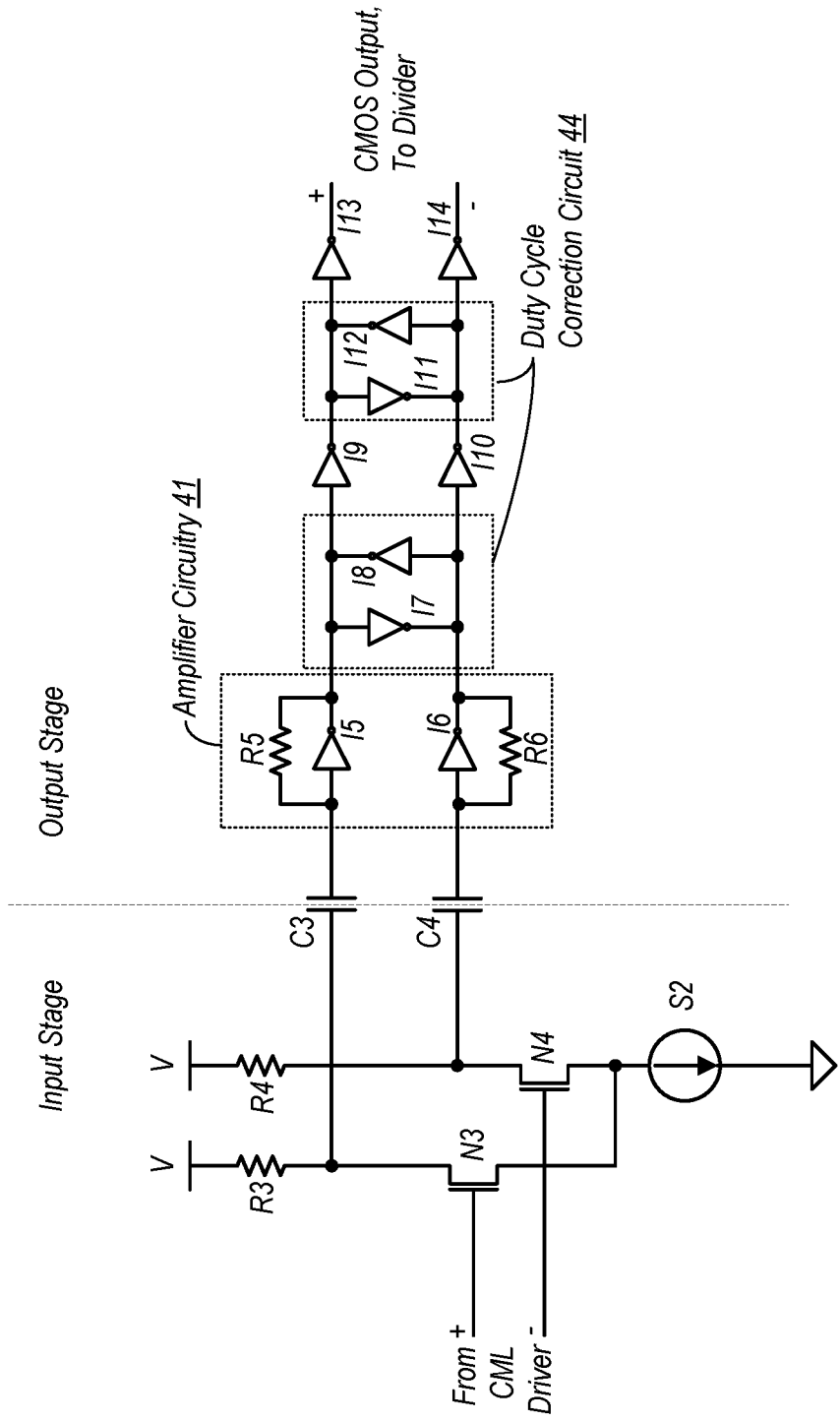
FIG. 5 is a schematic diagram of one embodiment of a CML receiver circuit.

FIG. 5 is a schematic diagram of one embodiment of a CML receiver circuit. In the embodiment shown, CML receiver circuit 32 is similar to CML driver 31 in that it includes an input stage and an output stage, with AC coupling capacitors coupled between the input and output of the circuit.

At the input, CML receiver 32 is coupled to receive the '+' and '-' components of the differential clock signal on the gate terminals of NMOS transistors N3 and N4. These transistors may be alternately activated, with N3 and N4 drawing current through resistors R3 and R4, respectively. The source terminals of N3 and N4 are both coupled to tail current source S2, which may provide additional current through these transistors when they are active.

AC coupling capacitors C3 and C4 in the embodiment shown inject current into the output stage. The differential signal is then pass through amplifier circuitry 41, which includes inverters I5 and I6, along with feedback resistors R5 and R6. The amplifier circuitry provides gain to the differential clock signal. It is noted that in some embodiments, I5 and I6 may be tristate inverters that may be turned on or off, and may thus allow the CML receive to be completely turned off. The differential clock signal is further fed through a first portion of duty cycle correction circuit 44 (comprising inverters I7 and I8), through inverters I9 and I10, and to a second portion of duty cycle correction circuit 44. It is noted that this portion of the circuitry may also provide AC gain. At duty cycle correction circuit 44, inverters I11 and I12 provide duty cycle correction to reduce duty cycle distortion that may have been incurred by the differential clock signal. Thereafter, the differential clock signal is provided to inverters I13 and I14, and subsequently output as a CMOS differential signal. In the embodiments discussed herein, the differential clock signal is provided to a divider (e.g., divider 26 as shown in FIG. 3). However, embodiment are possible and contemplate in which the differential clock signal (or a single rail thereof) is provided directly to clock consumer circuits.

Figure 6:
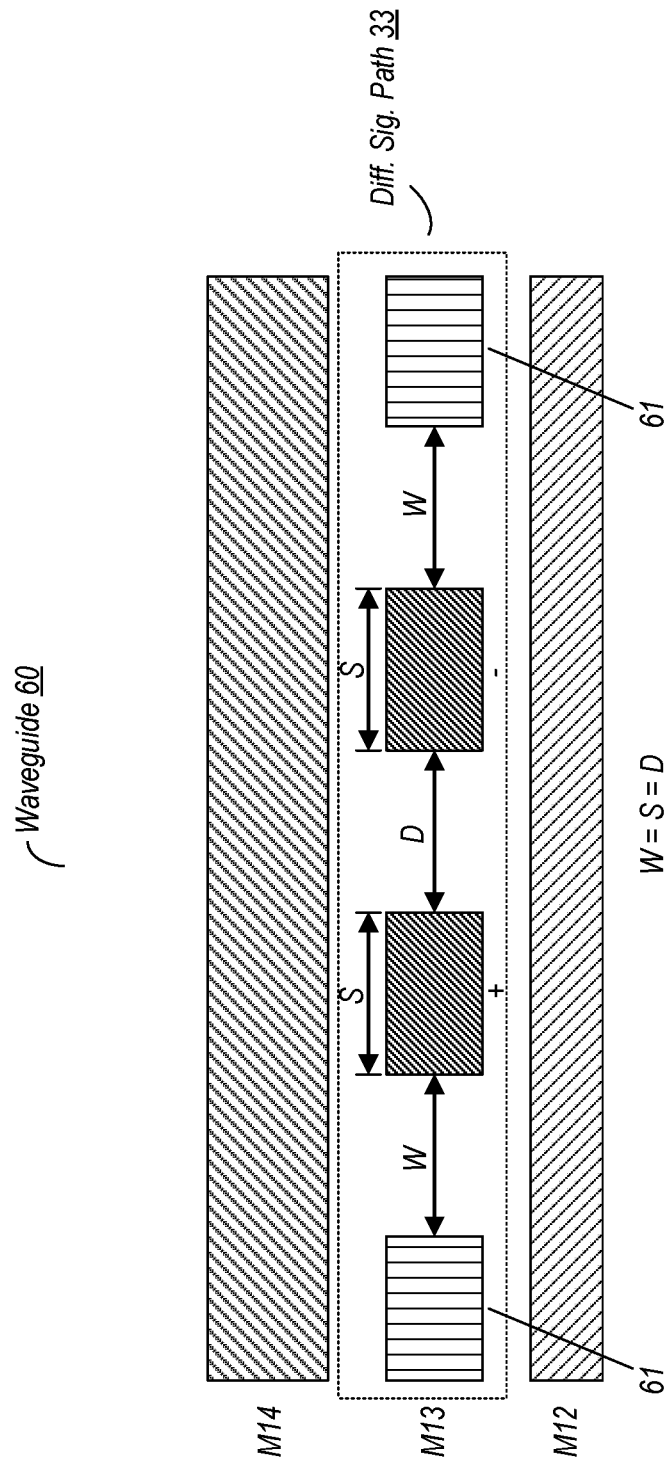
FIG. 6 is a side view of one embodiment of a waveguide used in conveying a differential clock signal.

FIG. 6 is a side view of one embodiment of a waveguide used in conveying a differential clock signal. In the embodiment shown, differential signal path 33 is implemented on exemplary metal layer M13 of an IC. In addition to the '+' and '−' signal tracks, differential signal path 33 also includes shielding tracks 61, each of which is implemented to the side of a corresponding one of the primary signal tracks. The width of both the '+' and '−' signal tracks, 'S', in this embodiment, is equivalent to the distance 'D' between them, as well as the distance 'W' to the shielding tracks 61. However, it is noted that these dimensions do not need to be equal for all embodiments, and can in fact vary based on factors such as design requirements and technology node/process technology. For modeling and simulation purposes, the differential signal path, and waveguide 60 overall, maybe modeled as a distributed RC circuit.

Waveguide 60 in this embodiment is shown as being sandwiched between metal layers M14 and M12. It is noted that the metal layers depicted here are exemplary, and that other embodiments of and IC may implement waveguide 60 on other metal layers.

Figure 7:
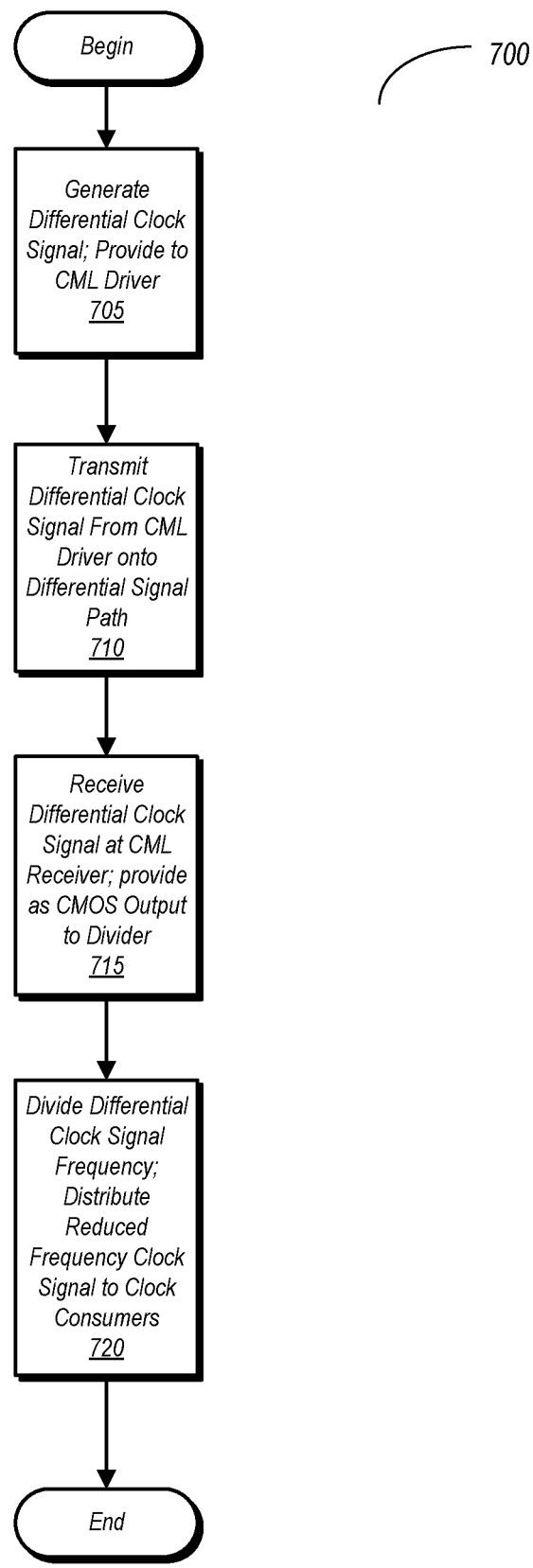
FIG. 7 is a flow diagram of one embodiment of a method for distributing a clock signal.

FIG. 7 is a flow diagram of one embodiment of a method for distributing a clock signal. Method 700 may be implemented using various embodiment of the clock distribution network/scheme discussed above. Other embodiments of a clock distribution network/scheme that may implement method 700 (including those in which the clock distribution network is across a PCB) are also possible and contemplated, and may thus fall within the scope of this disclosure.

Method 700 begins with the generation of a differential clock signal that is provided to an input of a CML driver (block 705). The CML driver may then transmit the differential clock signal as a CML signal onto a differential signal path (block 710). The differential clock signal may be received at a CML receiver, which may convert and provide the differential clock signal as a CMOS output, to a divider circuit (block 715). Thereafter, the divider circuit may divide the frequency of the differential clock signal to produce a reduced frequency clock signal, which is distributed to various clock consumers (block 720). It is noted that the reduced frequency clock signal distributed by the divider may be a single-ended or differential signal, depending on the specific embodiment.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a first communications circuit; and
   a clock distribution network coupled to the first communications circuit, wherein the clock distribution network comprises:
   a clock source; and
   a current mode logic (CML) driver coupled to receive a differential clock signal generated by the clock source and configured to transmit the differential clock signal over a differential signal path, wherein the CML driver includes a differential input coupled to receive the differential clock signal from the clock source, a CML output, and further includes AC coupling capacitors coupled between the differential input and the CML output;

a CML receiver coupled to receive the differential clock signal; and a swing detection circuit coupled to the differential signal path, wherein the swing detection circuit is configured to regulate a current provided by a current source of the CML driver based on a signal swing on each line in the differential signal path, wherein the current source of the CML driver is a single current source coupled to provide a tail current for both portions of the differential signal path.

2. The integrated circuit as recited in claim 1, wherein the first communications circuit is a transmitter circuit, and wherein the integrated circuit further comprises a second communications circuit coupled to receive a clock signal based on the differential clock signal received by the CML receiver, wherein the second communications circuit is a receiver circuit.

3. The integrated circuit as recited in claim 2, further comprising a plurality of transmitter circuits including the first communications circuit, and a plurality of receiver circuits including the second communications circuit, wherein each of the plurality of transmitter circuits and each of the plurality of receivers circuits is coupled to receive the clock signal that is based on the differential clock signal received by the CML receiver.

4. The integrated circuit as recited in claim 2, wherein the integrated circuit is coupled to a SERDES (serializer/deserializer) communications link that includes a plurality of transmitter circuits and a plurality of receiver circuits.

5. The integrated circuit as recited in claim 1, wherein the CML receiver includes a CML input and a CMOS output, and wherein the CML receiver includes AC coupling capacitors coupled between an input stage and an output stage of the CML receiver, wherein the AC coupling capacitors are configured to inject AC current into the output stage.

6. The integrated circuit as recited in claim 5, wherein the output stage of the CML receiver includes a duty cycle correction circuit including a pair of cross-coupled inverters, and further includes amplifier circuitry coupled to the AC coupling capacitors.

7. The integrated circuit as recited in claim 1, further comprising a divider coupled to receive the differential clock signal from the CML receiver, wherein the divider is configured to divide a frequency of the differential clock signal to generate a reduced frequency clock signal, and further coupled to provide the reduced frequency clock signal to the first communications circuit.

8. A method comprising:
generating a differential clock signal using a clock source;
providing the differential clock signal to a current mode logic (CML) driver;
providing, using AC coupling capacitors, AC coupling of the differential clock signal from an input stage of the CML driver to an output stage of the CML driver
driving the differential clock signal over a differential signal path to a CML receiver;
adjusting, using a swing detection circuit, a signal swing output from the CML driver based on a signal swing detected on each line in the differential signal path, wherein adjusting the signal swing comprises controlling a current of both first and second signal lines of the differential signal path using a single current source;
providing the differential clock signal from the CML receiver to a divider; and distributing a reduced frequency clock signal that is based on the differential clock signal to one or more communications circuits.

9. The method as recited in claim 8, wherein distributing the reduced frequency clock signal comprises providing the reduced frequency clock signal to at least one transmitter circuit and at least one receiver circuit.

10. The method as recited in claim 8, further comprising a duty cycle correction circuit in the CML receiver correcting a duty cycle of the differential clock signal.

11. The method as recited in claim 8, further comprising AC coupling capacitors in the CML receiver providing AC coupling of the differential clock signal from an input stage of the CML receiver to an output stage of the CML receiver.

12. A system comprising:
a communications link coupled between a first integrated circuit (IC) and a second IC, wherein the communications link includes, in the first IC, a first transmitter and a first receiver and further includes a first clock distribution network configured to distribute a first clock signal to the first transmitter and the first receiver, the first clock distribution network comprising:
a first clock source;
a first current mode logic (CML) driver coupled to receive a differential clock signal generated by the first clock source and configured to transmit the differential clock signal over a differential signal path, wherein the first CML driver includes a differential input coupled to receive the differential clock signal from the clock source, a CML output, and further includes AC coupling capacitors coupled between the differential input and the CML output;
a swing detection circuit coupled to the differential signal path, wherein the swing detection circuit is configured to regulate a current provided by a current source in the CML driver based on a signal swing on each line in the differential signal path, wherein the current source is coupled to control currents on each of first and second signal lines of the differential signal path;
a first CML receiver coupled to receive the differential clock signal; and
a first divider coupled to receive the differential clock signal from the first CML receiver, wherein the first divider is configured to divide a frequency of the differential clock signal to generate the first clock signal as a first reduced frequency clock signal, and further coupled to provide the first clock signal to the first transmitter and the first receiver.

13. The system as recited in claim 12, further comprising a second clock distribution network implemented in the second IC, wherein the second clock distribution network is configured to distribute a second clock signal to a second transmitter and a second receiver, the second clock distribution network including a second clock source, a second CML driver, a second CML receiver, and a second divider.

14. The system as recited in claim 12, wherein the first CML receiver includes a CML input and a CMOS output, and wherein the CML receiver includes AC coupling capacitors coupled between an input stage and an output stage of the CML receiver, wherein the AC coupling capacitors are configured to inject AC current into the output stage, and further includes a duty cycle correction circuit including a pair of cross-coupled inverters.

15. The system as recited in claim 12, wherein the communications link comprises a serializer/deserializer (SERDES) communications link between at least one functional circuit block in the first IC and another functional circuit block in the second IC.

* * * * *